United States Patent
Hsu et al.

(10) Patent No.: US 8,557,757 B2
(45) Date of Patent: Oct. 15, 2013

(54) MULTIPURPOSE ACIDIC, ORGANIC SOLVENT BASED MICROELECTRONIC CLEANING COMPOSITION

(75) Inventors: Chien-Pin S. Hsu, Basking Ridge, NJ (US); Glenn Westwood, Edison, NJ (US); William R. Gemmill, Bethlehem, PA (US)

(73) Assignee: Avantor Performance Materials, Inc., Phillipsburg, NJ (US)

( * ) Notice: Subject to any disclaimer, the term of this patent is extended or adjusted under 35 U.S.C. 154(b) by 62 days.

(21) Appl. No.: 13/138,467

(22) PCT Filed: Jan. 14, 2010

(86) PCT No.: PCT/US2010/020974
§ 371 (c)(1),
(2), (4) Date: Aug. 22, 2011

(87) PCT Pub. No.: WO2010/098899
PCT Pub. Date: Sep. 2, 2010

(65) Prior Publication Data
US 2011/0306534 A1    Dec. 15, 2011

Related U.S. Application Data

(60) Provisional application No. 61/155,309, filed on Feb. 25, 2009.

(51) Int. Cl.
*C11D 7/50* (2006.01)
(52) U.S. Cl.
CPC .................................. *C11D 7/50* (2013.01)
USPC .......................................... 510/175; 510/176
(58) Field of Classification Search
USPC ................................................. 510/175, 176
See application file for complete search history.

(56) References Cited

U.S. PATENT DOCUMENTS

| | | | |
|---|---|---|---|
| 4,215,005 A | 7/1980 | Vander Mey | 252/153 |
| 6,368,421 B1 | 4/2002 | Oberlander et al. | 134/40 |
| 6,531,436 B1 | 3/2003 | Sahbari et al. | 510/176 |
| 6,562,726 B1 | 5/2003 | Torek et al. | 438/745 |
| 6,783,695 B1 | 8/2004 | Torek et al. | 252/79.1 |
| 6,799,589 B2 | 10/2004 | Inagaki | 134/84 |
| 7,419,945 B2 * | 9/2008 | Hsu | 510/175 |
| 7,521,406 B2 * | 4/2009 | Hsu | 510/175 |
| 7,671,001 B2 * | 3/2010 | Skee | 510/175 |
| 7,767,636 B2 * | 8/2010 | Hsu | 510/175 |
| 7,825,078 B2 * | 11/2010 | Inaoka | 510/176 |
| 7,928,046 B2 * | 4/2011 | Ilardi et al. | 510/175 |
| 7,947,639 B2 * | 5/2011 | Inaoka | 510/176 |
| 7,951,764 B2 * | 5/2011 | Inaoka | 510/175 |
| 8,178,482 B2 * | 5/2012 | Kane | 510/175 |
| 2002/0037820 A1 | 3/2002 | Small et al. | 510/175 |
| 2002/0059943 A1 | 5/2002 | Inagaki | 134/18 |
| 2003/0082912 A1 | 5/2003 | Kezuka et al. | 438/689 |
| 2004/0009883 A1 | 1/2004 | Ikemoto et al. | 510/175 |
| 2005/0176602 A1 * | 8/2005 | Hsu | 510/175 |
| 2005/0176603 A1 * | 8/2005 | Hsu | 510/175 |
| 2005/0239673 A1 * | 10/2005 | Hsu | 510/176 |
| 2006/0154839 A1 * | 7/2006 | Ilardi et al. | 510/175 |
| 2006/0264043 A1 | 11/2006 | Stewart et al. | 438/678 |
| 2007/0060490 A1 * | 3/2007 | Skee | 510/175 |
| 2008/0051308 A1 * | 2/2008 | Kane | 510/176 |
| 2008/0103078 A1 * | 5/2008 | Inaoka | 510/176 |
| 2008/0287333 A1 * | 11/2008 | Inaoka | 510/176 |
| 2009/0156453 A1 * | 6/2009 | Inaoka | 510/176 |
| 2009/0163396 A1 * | 6/2009 | Hsu | 510/176 |
| 2010/0261632 A1 * | 10/2010 | Korzenski et al. | 510/175 |

* cited by examiner

*Primary Examiner* — Gregory Webb
(74) *Attorney, Agent, or Firm* — Hoffmann & Baron, LLP

(57) ABSTRACT

A cleaning composition for cleaning microelectronic or nanoelectronic devices, the cleaning composition having HF as the sole acid and sole fluoride compound in the composition, at least one primary solvent selected from the group consisting of sulfones and selenones, at least one polyhydroxyl alkyl or aryl alcohol co-solvent having metal ion complexing or binding sites, and water, and optionally at least one phosphonic acid corrosion inhibitor compound and the is free of amines, bases and other salts.

6 Claims, No Drawings

MULTIPURPOSE ACIDIC, ORGANIC SOLVENT BASED MICROELECTRONIC CLEANING COMPOSITION

This Application is the US National Stage Application of PCT/US2010/020974 filed Jan. 14, 2010 and claiming priority from U.S. Provisional Application Nos. 61/155,309 filed Feb. 25, 2009.

FIELD OF THE INVENTION

This invention relates to a microelectronic cleaning composition and to the use of such cleaning composition in a method of cleaning microelectronic devices, particularly for advanced ≤45 nm back end of the line Cu low-$_k$ integration systems, and more particularly those employing metal hard mask and CoWP metal capping layers. The cleaning compositions of this invention are also useful for front end of the line cleaning processes.

BACKGROUND TO THE INVENTION

The recent advances in production of micro- and nanoelectronic devices has resulted in the need for new stripping and cleaning compositions for both front end of the line (FEOL) and back end of the line (BEOL) stripping or cleaning compositions. The cleaning compositions typically employed heretofore have not been found to be entirely suitable for the new advanced materials employed in production of microelectronic or nanoelectronic platforms. Frequently the previous employed stripping or cleaning compositions are too aggressive and/or are not selective enough. Among the newly utilized materials employed to produce these newer microelectronic or nanoelectronic devices are materials such as low-$_k$ (<3) and high-$_k$ (>20) and porous dielectrics, copper metallizations, fluoropolymer antireflective coatings (ARCs), special hard masks such as those composed of Ti and TiN, strained wafers of Si/Ge or Ge, and metal capping layers such as those of CoWP and CoWB. These new materials present new and difficult challenges to the device manufacturer.

For example, cleaning of Cu/low-κ structures not only requires good cleaning capabilities, but also needs exceptional substrate compatibilities. Many process technologies that have been developed for the "traditional" or common semiconductor devices containing Al/SiO$_2$ or Al (Cu)/SiO$_2$ structures cannot be applied to Cu/low-κ and high-κ structures. Vice versa, many Cu/low-κ strippers are not suitable for Al metallizations, unless significant adjustments are made.

The manufacturing processes of Cu/low-κ and/or high-κ structures frequently generate unusually hardened photoresist layers, tough plasma etching and/or ashing residues. Even highly aggressive reagents, such as HF acid, hydroxylamine and strong alkaline solutions, often fail to provide required cleaning with acceptable substrate compatibility.

Aqueous fluorides or HF based solutions have been used extensively as traditional FEOL and BEOL etchants and cleaning agents. Frequently, these types of cleaners are developed as oxide etcher or ash residue removers. For example, diluted HF (dHF) solutions and buffered oxide etch (BOE, consists of HF/NH$_4$F/H$_2$O) are effective oxide (silicon oxide) remover and limited residue cleaners, but generally non-effective in stripping photoresist.

A number of organic solvent-based or semi-aqueous solutions containing fluorides or HF have also been used in many BEOL applications. However, most of these products are still weak in multi-purpose applications such as removing plasma hardened photoresist and ARCs. They are also sometimes too aggressive, non-selective enough, or cannot meet new, highly demanding substrate compatibilities and selectivity requirements for advanced FEOL and BEOL applications with new challenging types of materials such as low-$_k$ and high-$_k$ and porous dielectrics, copper metallizations, fluoropolymer antireflective coatings (ARCs), special hard metal gates such as those of Ti and TiN, strained wafers of Si/Ge or Ge, and metal capping layers such as those of CoWP and CoWB. Thus, new and improved stripping or cleaning compositions are needed for multi-purpose applications in connection with these new material being employed on newer microelectronic and nanoelectronic devices.

SUMMARY OF THE INVENTION

In aqueous solutions, HF dissociation can be expressed in the following equations:

  (1)

  (2)

While both HF and HF$_2^-$ are effective etching agents, the dominant etching species of SiO$_2$ is HF$_2^-$. One approach to have high compatibility with TEOS, low-κ and porous low-κ dielectrics is to control/lower HF$_2^-$ content. A number of factors will have significant effects on the contents of HF, F$^-$ and HF$_2^-$, including pH, acidity, alkalinity, ionic strength and solvent matrices. In accordance with the invention one novel way to vary the content of these fluoride species is by controlling/altering dielectric constants of solution matrices. While water has a high dielectric constant (∈) of 78.54 at 25° C., a number of organic solvents have significantly lower dielectric constants: e.g., sulfolane, 43.3; ethylene glycol, 37.7; isopropanol, 19.9; dimethyl sulfoxide, 46.68. Thus, addition of such solvents can be expected to lower the resulting solutions' dielectric constants, leading to enrichment of non-disassociated HF and reduction of bifluoride, HF$_2^-$. Using this discovered concept and coupling with other special designs considerations, a novel class of multi-purpose strippers or cleaners that can deliver the required cleaning capabilities and with the necessary substance compatibilities is provided by this invention. The stripping cleaning compositions of this invention are those comprising, consisting essentially of, or consisting of:

- HF as the sole acid other than a phosphonic acid corrosion inhibitor and sole fluoride compound in the composition,
- at least one primary solvent selected from the group consisting of sulfones and selenones,
- at least one polyhydroxyl alkyl or aryl alcohol co-solvent having metal ion complexing or binding sites, and
- water, and
- optionally at least one phosphonic acid corrosion inhibitor compound, and wherein said cleaning compositions are free of amines, bases and other salts and have a pH ≤5.5. Optionally, the composition may contain surfactants and other metal chelating agents that are generally known in the art. When employed hereafter in this application reference to the percentages of these components present in the cleaning compositions of this invention are percentages by weight based on the total weight of the cleaning composition, unless specifically stated otherwise.

The cleaning compositions of this invention may be employed as FEOL and/or BEOL cleaning compositions for microelectronic or nanoelectronic devices. The cleaning compositions of this invention are especially useful to clean a microelectronic or nanoelectronic device having present photoresist, copper metallization, a low-$_k$ dielectric, and at least one other element selected from a hard metal Ti or TiN mask, an antireflective coating, or a CoWP or CoWB metal capping layer.

DETAILED DESCRIPTION AND PREFERRED EMBODIMENTS

The cleaning compositions of this invention are those comprising, consisting essentially of, or consisting of:
- HF as the sole acid other than a phosphonic acid corrosion inhibitor and sole fluoride compound in the composition,
- at least one primary solvent selected from the group consisting of sulfones and selenones,
- at least one polyhydroxyl alkyl or aryl alcohol co-solvent having metal ion complexing or binding sites, and
- water, and
- optionally at least one phosphonic acid corrosion inhibitor compound, and wherein said cleaning compositions are free of amines, bases and other salts and haves a pH ≤5.5.

The HF is usually employed as a diluted HF thereby providing not only the HF component but the water component as well. Any suitable diluted HF may be employed, generally in a 50:1 water:HF form of the HF. The amount of HF present in the cleaning composition of this invention will generally range from about 0.01% to about 10%, preferably from about 0.1% to about 5%, and more preferably about 0.1% to about 1%, and still more preferably about 0.2%. The water will be present in the cleaning compositions of this invention in an amount of from about 0.1% to about 49%, preferably about 1% to about 40%, more preferably about 10% to about 20%, and still more preferably about 18%.

Any suitable sulfone or selenone primary solvent may be employed in the cleaning compositions of this invention, preferably sulfone primary solvents. Among suitable primary solvent there may be mentioned sulfones such as sulfolane, methyl sulfone, ethyl sulfone, dimethyl sulfone, diethyl sulfone, dibutyl sulfone, methyl phenyl sulfone, 2,2'-sulfonyl diethanol, 4-(methyl sulfonyl) toluene, ethyl phenyl sulfone, di-p-toluyl sulfone and corresponding selenones, preferably methyl sulfone and sulfolane, and more preferably sulfolane. The primary solvent component of the composition will generally comprise from about 20% to about 60%, preferably from about 25% to about 50%, and more preferably from about 30% to about 40%, and will generally preferably be sulfolane.

Any suitable polyhydroxyl alkyl or aryl alcohol co-solvent component having metal ion complexing or binding sites may be employed in the cleaning compositions of this invention. The polyhydroxyl alkyl alcohols will generally be polyhydroxyl alkyl alcohols containing from about 2 to about 20 carbon atoms, preferably from about 2 to about 10 carbon atoms and more preferably about 2 to about 6 carbon atoms. Examples of such suitable polyhydroxy alkyl alcohols include, but are not limited to, ethylene glycol, diethylene glycol, propylene glycol, butylenes glycol and glycerol. The polyhydroxyl aryl alcohols will generally be polyhydroxy aryl alcohols containing from 6 to 14 carbon atoms, preferably 6 carbon atoms. Examples of such polyhydroxy aryl alcohols include, but are not limited to, catechol and pyrogallol. The polyhydroxyl co-solvent will generally be present in the cleaning composition in an amount of from about 20% to about 70%, preferably about 25% to about 60%, more preferably about 30% to about 50%, and will generally preferably be ethylene glycol.

Any suitable phosphonic acid corrosion inhibitor may optionally be employed in the compositions of this invention. Among suitable phosphonic acid corrosion inhibitors there may be mentioned, for example, but not limited to, aminotrimethylenephosphonic acid, diethylenetriaminepenta(methylenephosphonic acid) (DETPA), N,N,N',N'-ethylenediaminetetra(methylenephosphonic) 1,5,9-triazacyclododecane-N,N',N''-tris(methylenephosphonic acid) (DOTRP), 1,4,7,10-tetraazacyclododecane-N,N',N'',N'''-tetrakis(methylenephosphonic acid) (DOTP), nitrilotris (methylene) triphosphonic acid, diethylenetriaminepenta(m-ethylenephosphonic acid) (DETAP), aminotrimethylenephosphonic acid, 1-hydroxyethylene-1,1-diphosphonic acid, bis(hexamethylene)triamine phosphonic acid, 1,4,7-triazacyclononane-N,N',N''-tris(methylenephosphonic acid (NOTP) and the like. Preferably the phosphonic acid corrosion inhibitor is aminotrimethylenephosphonic acid. The phosphonic acid corrosion inhibitor component, if present in the cleaning composition will generally be present in an amount of from about 0.01% to about 5%, preferably from about 0.01% to about 2%, and still more preferably about 0.01% to about 1%, and even more preferably at about 0.1%.

The cleaning compositions of this invention may optionally have present in the compositions any suitable surfactant. Suitable surfactants include, but are not limited to Surfynol™ 61, Surfynol™ 465 and Zonyl™ FSH.

In an embodiment of the invention effective cleaning of microelectronic or nanoelectronic devices occurs by contacting the device with a cleaning composition of this invention at any time and temperature suitable for removal of components or residues of the devices. Generally such cleaning will occur at a temperature of from about 30° C. to about 100° C. and over a period of time ranging from about 1 to about 40 minutes depending upon the particular cleaning composition utilized and the particular microelectronic or nanoelectronic device to be cleaned.

A preferred cleaning composition of this invention comprises, consists essentially of, or consists of HF, sulfolane, ethylene glycol and water. Another preferred composition of this invention comprises, consists essentially of, or consists of HF, sulfolane, ethylene glycol water and aminotrimethylenephosphonic acid. Especially preferred cleaning compositions of this invention comprise a cleaning composition comprising, consisting essentially of, or consisting of about 0.2% HF, about 36.4% sulfolane, about 45.4% ethylene glycol and about 18% water, and a cleaning composition comprising, consisting essentially of, or consisting of about 0.2% HF, about 36.3% sulfolane, about 45.4% ethylene glycol, about 18% water and about 0.1% aminotrimethylenephosphonic acid.

The stripping and non-corrosive performance of cleaning compositions of this invention is illustrated by, but not limited to, the following test results utilizing the following cleaning composition of this invention. Composition A of this invention consists of about 0.2% HF, about 36.4% sulfolane, about 45.4% ethylene glycol and about 18% water. Composition B of this invention consists of about 0.2% HF, about 36.3% sulfolane, about 45.4% ethylene glycol, about 18% water and about 0.1% aminotrimethylenephosphonic acid. A comparison cleaning composition exemplary of a typical prior art cleaning composition was employed in the test for comparative purposes. That Comparative Composition consisted of an aqueous dHF (1000:1) solution, herein after referred to as 1000:1 dHF.

Prime silicon substrate wafers of 200 nm diameter having thereon a 5000 Å thick PE-TEOS, 500 Å thick SiC, a 2600 Å thick Black Diamond dielectric, 500 Å thick Shipley AR19 fluoropolymer ARC, and a 3000 Å thick Tokyo Ohka TARF-P6111 photoresist was employed in this example. After a typical etch of the photoresist, ARC and dielectric, and ashing of the photoresist and ARC the wafers were treated for 3 minutes at 45° C. in small beakers equipped with a stir bar and stir rate of 400 rpm and containing either Composition A or the 1000:1 dHF Comparative Composition. The wafer treated in the 1000:1 dHF was not completely clean whereas the wafer treated with Composition A was completely cleaned, i.e., all residues were completely removed from the wafer. Additionally no significant corrosion or damage to the low-k dielectric was observed with Cleaning Composition A. Thus, the cleaning compositions of this invention provide superior cleaning ability compared to dHF cleans, especially for wafers were a 193 nm photoresist and a fluoropolymer ARC are present.

The following test was conducted to compare 1000:1 dHF with Cleaning Composition A in terms of possible TiN etching since TiN is commonly used as the basis for a metal based hard mask in integration schemes that utilize metal based hard masks. Test samples of TiN were immersed in Cleaning Composition A and in 1000:1 dHF Comparative Composition at temperatures ranging from about 25° C. about 55° C. for a period of from about 2 to about 16 minutes. The TiN etch rates were essentially the same for both Composition A and 1000:1 dHF over the time and temperature ranges of the tests. Both 1000:1 dHF and Composition A were observed to behave similarly and remove TiN films of about 50 nm thickness quickly after an induction period, due to an oxide layer, showing that the cleaning compositions of this invention can be readily substituted for dHF in cleaning applications where a better residue remover is desired, yet still obtaining essentially the same performance that dHF can provide in terms of TiN etching to remove hard masks.

Evaluation of Ti and TiN etch rates were evaluated for both Compositions A and B of this invention. First, Ti and TiN metal pieces were treated by immersion in Composition A at 45° C. for ten minutes and then Ti and TiN etch rates determined. Then, Ti and TiN metal pieces were treated by immersion in Composition B at 45° C., 75° C. and 90° C. over a 30 minute period. The etch rates in Angstrom/minute were determined by 4 pt. Probe. The etch rate results are set forth in Table 1. As seen from the data the presence of the optional phosphonic acid corrosion inhibitor components make the cleaning compositions of this invention Ti and TiN compatible at even higher temperatures. Both dHF and Composition A are incompatible with Ti and TiN at elevated temperatures, so it is advantages to utilize compositions like Composition B that contains a phosphonic acid corrosion inhibiting compound.

TABLE 1

|  | Comp. A 45° C. | Comp. B 45° C. | Comp. B 75° C. | Com. B 90° C. |
|---|---|---|---|---|
| Ti | >50 Å/min | <0.5 Å/min | <0.5 Å/min | <0.5 Å/min |
| TiN | >50 Å/min | <0.5 Å/min | <0.5 Å/min | <0.5 Å/min |

Corrosion inhibitor sticking to copper can result in increased via resistance, but it is acceptable for the inhibitor to stick to the Ti or TiN hard masks. XPS was used to show that the phosphonic acid corrosion inhibitor does not stick to copper. The presence of corrosion inhibitor remaining on the copper can result in problem preventing o proper adhesion of elements to the device during subsequent fabrication or processing steps, whereas sticking of the corrosion inhibitor on Ti or TiN does not present such a problem. Ti and Cu films on silicon wafers were treated in water (control) and Composition B for 10 minutes at 45° C. followed by a 30 second $H_2O$ rinse and dried with nitrogen. XPS was used to determine if any corrosion inhibitor remained on the surfaces. The N1s region was used to monitor the corrosion inhibitor's interaction with metal surface by seeing if the amino nitrogen was present on the surface. No corrosion inhibitor was observed on Cu surfaces after treatment, but the corrosion inhibitor was observed on Ti surface post treatment.

Blanket silicon wafers of CoWP on Cu were treated with Composition A for 2 min. at 35° C. and also in 1000:1 dHF for 2 min. at 35° C. XPS was used to characterize the surfaces after treatment and compare the damage caused by both formulations. In both cases, a comparison of the oxidized and unoxidized CoWP (Co $2p^{3/2}$, W 4f, and P 2p) indicates that both these formulations reduce the percentage of oxidized CoWP at the surface of the CoWP film relative to the untreated film. This reduction in oxidized material is confirmed by the % 0 in these films as listed in Table 2. Both Composition A and 1000:1 dHF treated CoWP show a comparable decrease in % 0 (removal of oxidized material) relative to the untreated wafer.

The XPS results described above were also used to determine which formulation causes less damage to the CoWP. Table 2 shows the ratio of % Co:% Cu as determined by quantitative analysis of the XPS results. A lower value in this ratio indicates that a greater amount of Cu is exposed near the surface of the wafer and there is a loss of CoWP. While both Composition A and 1000:1 dHF clearly cause damage to CoWP, Composition A is less damaging than 1000:1 dHF.

TABLE 2

| XPS results | | |
|---|---|---|
| Formulation | % Co:% Cu | % O |
| Untreated | 135 | 68 |
| Composition A | 9 | 43 |
| 1000:1 dHF | 2.5 | 41 |

While the invention has been described herein with reference to the specific embodiments thereof, it will be appreciated that changes, modification and variations can be made without departing from the spirit and scope of the inventive concept disclosed herein. Accordingly, it is intended to embrace all such changes, modification and variations that fall with the spirit and scope of the appended claims.

The invention claimed is:

1. A cleaning composition for cleaning microelectronic or nanoelectronic devices, the cleaning composition comprising:

About 0.2% HF,
at least one primary solvent selected from the group consisting of sulfones and selenones,
wherein said primary solvent comprises about 36.4% sulfolane,
at least one polyhydroxyl alkyl or aryl alcohol co-solvent having metal ion complexing or binding sites, wherein said co-solvent comprises about 45.4% ethylene glycol, about 18% water, and optionally at least one phosphonic acid corrosion inhibitor compound, said cleaning composition being free of, bases, and other salts, and has a pH ≤5.5, and wherein the percentages are by weight based on the total weight of the composition.

2. A cleaning composition according to claim 1 wherein the optional at least one phosphonic acid corrosion inhibitor compound is present and is selected from the group consisting of aminotrimethylenephosphonic acid, diethylenetriaminepenta(methylenephosphonic acid) (DEPTA), N,N,N,N'-ethylenediaminetetra(methylenephosphonic), 1,5,9-triazacyclododecane-N,N',N''-tris(methylenephosphonic acid) (DOTRP), 1,4,7,10-tetraazacyclododecane-N,N',N'',N'''-tetrakis(methylenep-hosphonic acid) (DOTP), nitrilotris(methylene) triphosphonic acid, diethylenetriaminepenta(m-ethylenephosphonic acid) (DETAP), aminotri(methylenephosphonic acid), 1-hydroxyethylene-1,1-diphosphonic acid, bis(hexamethylene)triamine phosphonic acid, and 1,4,7-triazacyclononane-N,N',N''-tris(methylenephosphonic acid (NOTP).

3. A cleaning composition according to claim 2 wherein the phosphonic acid corrosion inhibitor compound is aminotrimethylenephosphonic acid.

4. A cleaning composition according to claim 1 comprising about 0.2% HF, about 36.3% sulfolane, about 45.4% ethylene glycol, about 18% water and about 0.1% aminotrimethylenephosphonic acid, and wherein the percentages are by weight based on the total weight of the composition.

5. A process for cleaning a microelectronic or nanoelectronic device, the process comprising contacting the microelectronic or nanoelectronic device with a cleaning composition of claim 1 for a time and temperature sufficient to remove the photoresist.

6. A process according to claim 5 wherein the device to be cleaned has photoresist, copper metallization, a low-$_k$ dielectric, and at least one other element selected from a hard metal Ti or TiN mask, an antireflective coating, or a CoWP metal capping layer.

* * * * *